United States Patent
Ference et al.

(10) Patent No.: US 6,642,080 B1
(45) Date of Patent: Nov. 4, 2003

(54) CHIP-ON-CHIP INTERCONNECTIONS OF VARIED CHARACTERSTICS

(75) Inventors: Thomas George Ference, Essex Junction, VT (US); Wayne John Howell, Williston, VT (US); Edmund Juris Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/691,546

(22) Filed: Oct. 18, 2000

Related U.S. Application Data

(62) Division of application No. 09/105,477, filed on Jun. 26, 1998, now Pat. No. 6,225,699.

(51) Int. Cl.[7] .......................... H01L 21/44; H01L 21/48; H01L 21/50; H01L 23/48; H01L 23/52; H01L 29/40; H01L 23/34
(52) U.S. Cl. .................... 438/109; 257/777; 257/723
(58) Field of Search .................... 438/109; 257/777, 257/723; 228/180.21, 180.22

(56) References Cited

U.S. PATENT DOCUMENTS

| | | |
|---|---|---|
| 4,703,483 A | 10/1987 | Enomoto et al. |
| 4,984,358 A * | 1/1991 | Nelson ........................ 29/830 |
| 5,109,320 A | 4/1992 | Bourdelaise et al. |
| 5,251,806 A * | 10/1993 | Agarwala et al. ........... 228/180 |
| 5,323,060 A | 6/1994 | Fogal et al. |
| 5,399,898 A | 3/1995 | Rostoker |
| 5,401,672 A | 3/1995 | Kurtz et al. |
| 5,434,453 A | 7/1995 | Yamamoto et al. |
| 5,446,247 A | 8/1995 | Cergel et al. |
| 5,495,394 A | 2/1996 | Kornfeld et al. |
| 5,541,449 A | 7/1996 | Crane, Jr. et al. |
| 5,563,773 A | 10/1996 | Katsumata |
| 5,576,519 A | 11/1996 | Swamy |
| 5,600,541 A | 2/1997 | Bone et al. |
| 5,760,478 A | 6/1998 | Bozsco et al. |
| 5,790,384 A * | 8/1998 | Ahmad et al. ............... 361/760 |
| 5,933,712 A * | 8/1999 | Bernhardt et al. .......... 438/125 |
| 6,100,593 A * | 8/2000 | Yu et al. ...................... 257/777 |
| 6,339,254 B1 * | 1/2002 | Venkateshwaran et al. . 257/686 |

OTHER PUBLICATIONS

IBM Technical Disclosure Bulletin, vol. 22, No. 10 Mar. 1980, High Performance Package with Conductive Bonding to Chips, Coombs et al., 2 pages.
IBM Technical Disclosure Bulletin, vol. 14, No. 6 Nov. 1971, Chip Joining Process, Lavanant et al., 2 pages.
Interconnect Reliability of Ball Grid Array and Direct Chip Attach, Topic 2, Andrew Mawer, 17 pages.
IBM Technical Disclosure Bulletin, vol. 10, No. 5, Semiconductor Chip Joining, Miller et al., 2 pages.
IBM Technical Disclosure Bulletin, vol. 31 No. 2 Jul. 1988, Plastic Package for Semiconductors with Integral Decoupling Capacitor, Howard et al., 2 pages.
IBM Technical Disclosure Bulletin, vol. 36, No. 12 Dec. 1993, Postage Stamp Lamination of Reworkable Interposers for Direct Chip Attach, pp. 487 and 488.

* cited by examiner

*Primary Examiner*—Carl Whitehead, Jr.
*Assistant Examiner*—Nema Berezny
(74) *Attorney, Agent, or Firm*—Schmeiser, Olsen & Watts; Anthony Canale

(57) ABSTRACT

Chip-on-chip interconnections of varied characteristics, such as varied diameters, heights and/or composition, are disclosed. A first chip-on-chip interconnection on a joining plane has a first characteristic (e.g., a first height) and a second chip-on-chip interconnection on the same joining plane has a second characteristic (e.g., a second height greater than the first height). The first and second characteristics of the chip-on-chip interconnections allow for chip-on-chip connections to other packages, substrates or chips of different levels and/or compositions.

21 Claims, 6 Drawing Sheets

CHIP-ON-CHIP INTERCONNECTIONS OF VARIED CHARACTERSTICS

RELATED APPLICATIONS

This application is a divisional of Ser. No. 09/105,477, filed on Jun. 26, 1998, now U.S. Pat. No. 6,225,699 issued May 1, 2000.

This application is related to two applications: U.S. Ser. No. 09/105,382 entitled "Micro-flex Technology in Semiconductor Packages", by Bertin et al; and U.S. Ser. No. 09/105,419 entitled "Highly Integrated Chip-on-Chip Packaging",by Bertin et al. The related applications are assigned to the assignee of record, are filed concurrently herewith, and are herein incorporated by reference.

BACKGROUND OF THE INVENTION

1. Technical Field

The invention relates generally to semiconductor devices, and more specifically, to chip-on-chip interconnections in semiconductor devices.

2. Background Art

In the past, semiconductor devices built with different technologies were fabricated on separate wafers, diced, and then connected together by mounting the devices on a substrate. Recently, the merging of DRAM and logic, and other dissimilar semiconductor technologies has been headed towards connecting one chip directly to another chip through solder ball connections, such as C4 (controlled collapse chip connection) connections. This structure, known as a face-to-face chip-on-chip (chip1/chip2) structure, provides a large number of I/O's between the two chips and is shown in the following IBM Technical Disclosure Bulletins: Vol. 28 No. 2, July 1985 "Mated Array Chip Configuration",pgs. 811–812; and Vol. 25 No. 10, March 1983 "Chip-On-Chip Module for Assembly" by Spector et al., pgs. 5315–5316. Although the chip1/chip2 structure of the aforementioned bulletins and other similar structures are joined through C4 technology, there is a limit to how the connections can be made between the chips as well as connections made to the outside package. Thus, other chip-on-chip connections, such as wirebonding, are necessary to connect the chip1/chip2 structure to other chips or to the outside package. These other connections may not be as easily manufactured or as durable as the C4 solder ball connection.

SUMMARY OF THE INVENTION

It is thus an advantage of the present invention to provide chip-on-chip interconnections of varied characteristics that eliminate the above described limitations.

The advantages of the invention are realized by chip-on-chip interconnections (e.g., C4 interconnections, solder ball interconnections, polyimer-metal composite interconnections, plated copper columns, micro-velcro connections, etc.) of varied diameters, heights and/or composition, allowing for connections between devices and substrates at different levels or composition. That is, a first chip-on-chip interconnection on a joining plane has a first characteristic (e.g., a first height) and a second chip-on-chip interconnection on the same joining plane has a second characteristic (e.g., a second height greater than the first height). The first and second characteristics of the chip-on-chip interconnections allow for a first and second chip-on-chip connection to other packages, substrates or chips.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
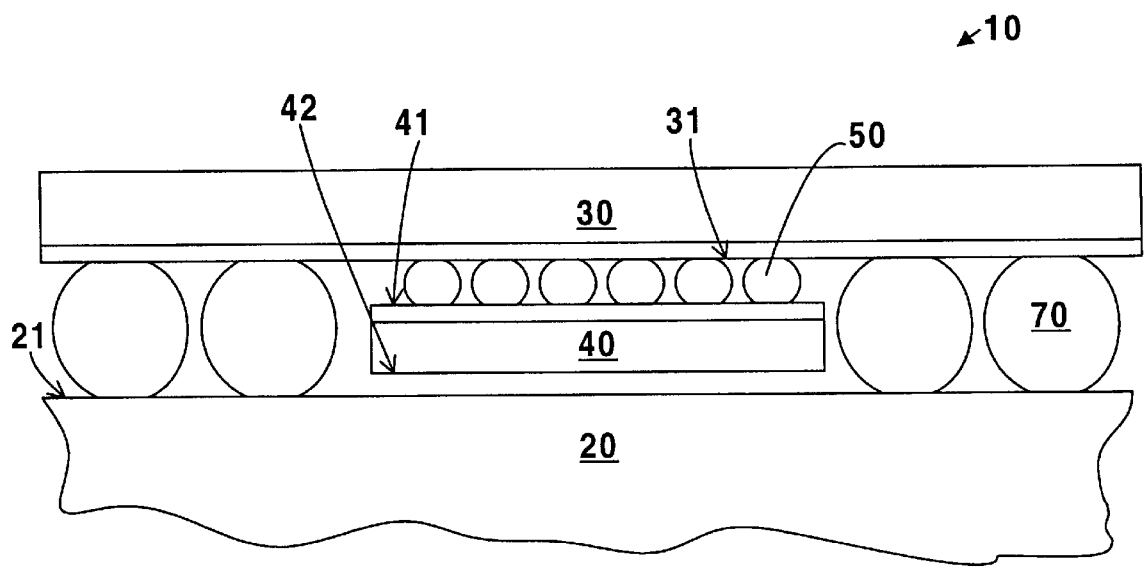
FIG. 1 is an exemplary semiconductor package using chip-on-chip interconnections in accordance with a preferred embodiment of the present invention.

Referring to FIG. 1, a cross-sectional diagram of an exemplary semiconductor package 10 having a first chip-on-chip interconnection 50 and a second chip-on-chip interconnection 70 in accordance with a preferred embodiment of the present invention is shown. A chip1/chip2 structure is shown with the face of one chip (chip1) 40 connecting directly to the face of a second chip (chip2) 30. The first chip-on-chip interconnection 50 facilitates the connection of chip 40 to chip 30. The second chip-on-chip interconnection 70, which is of a different characteristic than the first chip-on-chip interconnection 50, facilitates the joining of chip 30 and the assembly to a package, substrate, or third chip 20. Such varied characteristics of the chip-on-chip interconnections include, but are not limited to, height, diameter, composition, or a combination thereof. Thus, the present invention provides chip-on-chip interconnections of different diameters, heights and/or composition all on the same joining plane (e.g., chip 30 in this example); allowing for connections between devices and substrates at different levels and/or compositions. Although a chip1/chip2 structure is specifically shown for this example, it is to be understood that other chip, substrate and package structures may be used that could benefit from the chip-on-chip interconnections of the present invention. Furthermore, the chip-on-chip interconnections of the present invention preferably consist of solder balls and solder columns, but are not limited to such. Other conductive interconnections may be used such as polyimer-metal composite interconnections, plated copper columns, micro-velcro connections, etc.

Figure 2:
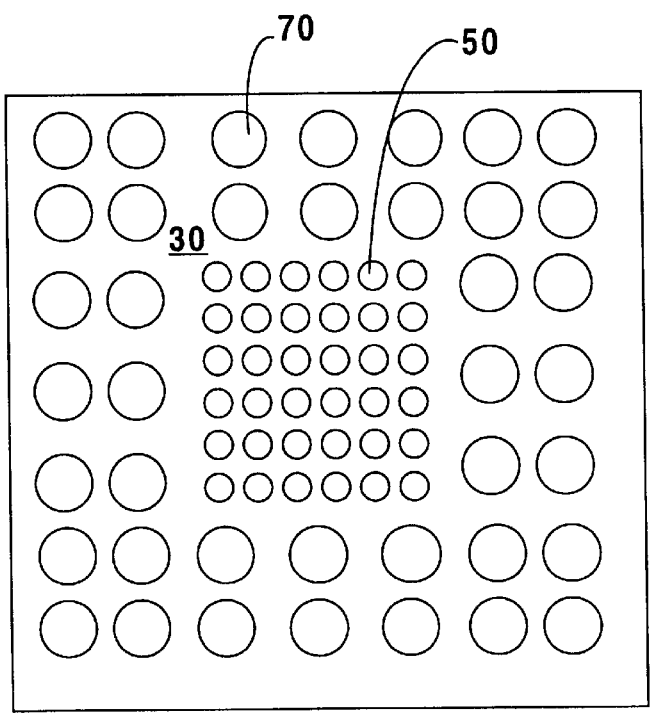
FIG. 2 is a planar view of the chip-on-chip interconnections of FIG. 1.

A planar view of the chip-on-chip layout of FIG. 1 is shown in FIG. 2. As aforementioned, the first chip-on-chip interconnection 50 is shown that has a different characteristic than the second chip-on-chip interconnection 70. The chip-on-chip interconnections may differ in diameter, height and/or composition, whatever is necessary to achieve the desired joining between the multiple levels of devices.

FIGS. 3–7 illustrate an exemplary fabrication sequence of the first and second chip-on-chip interconnections of FIG. 1. For this, and subsequent examples, the chip-on-chip interconnections will be described as a controlled collapse chip connection (C4), but will not be limited to such. Also, although in this example, the resulting C4 interconnections vary from each other in height, diameter and composition, the interconnections could easily vary only in height, diameter, composition or combinations thereof depending upon the fabrication process employed. The variations of the chip-on-chip interconnections are achievable through a plating process, as will be seen in the subsequent examples.

Figure 3:
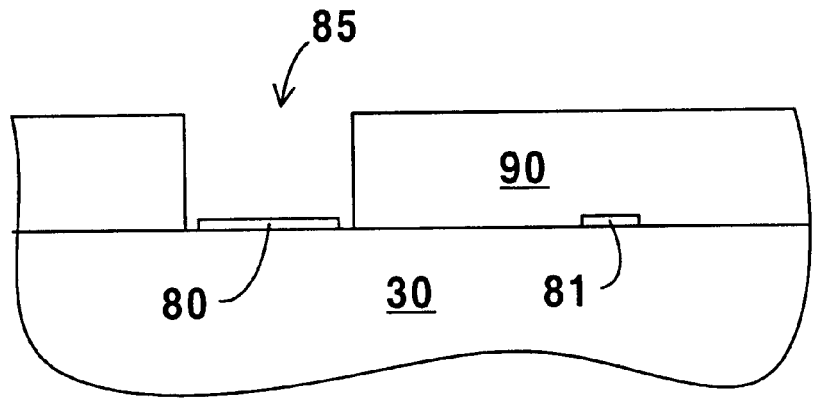
FIGS. 3, 4, 5, 6 and 7 are cross-sectional views showing a fabrication sequence of the chip-on-chip interconnections of FIG. 1 in accordance with a first embodiment of the present invention.
Figure 4:
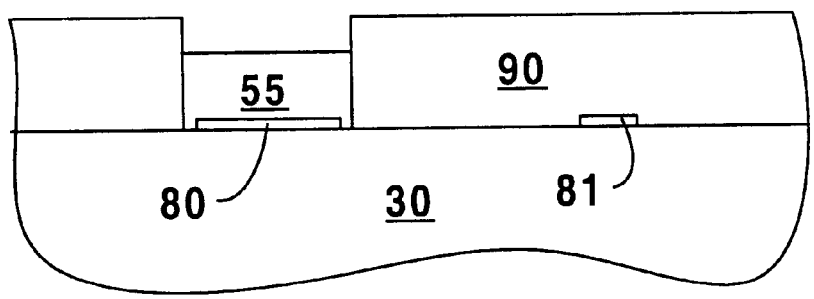
Figure 5:
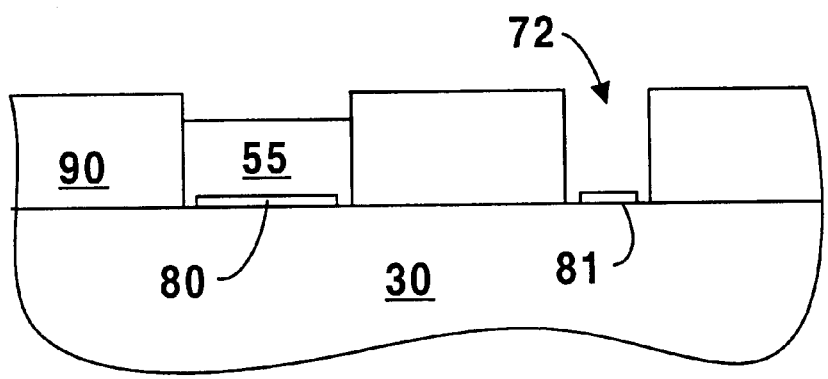
Figure 6:
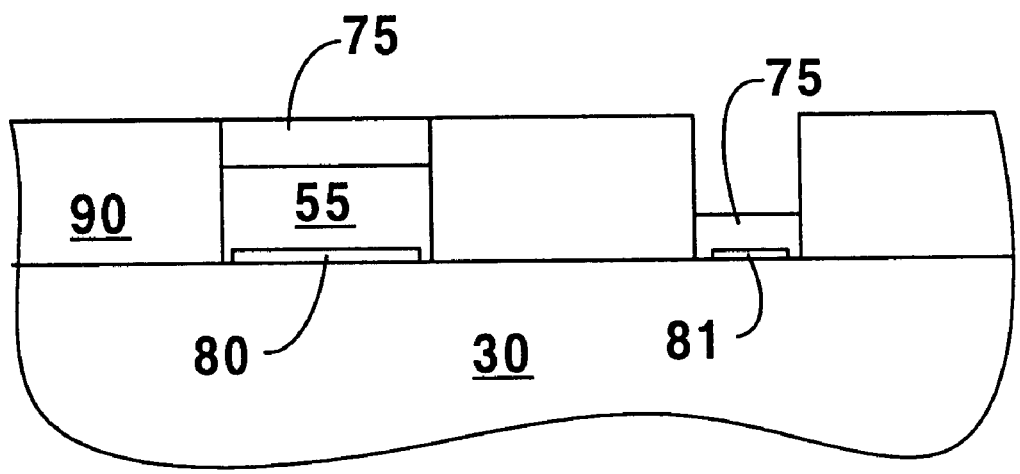
Figure 7:
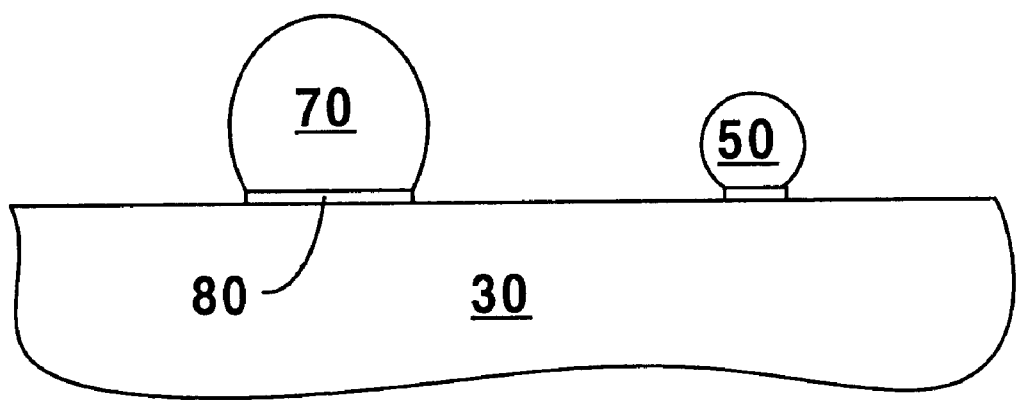

FIG. 3 illustrates the first step in the fabrication sequence for the first and second chip-on-chip interconnections of FIG. 1. A plating mask 90 is laid over chip 30. An opening 85, over the C4 pad 80 that will be plated to, is defined through a process such as photolithography. The height of plating mask 90 determines the height of the tallest C4 interconnection and the combined size of opening 85 and C4 pad diameter 80 determines the diameter of the C4 interconnection for C4 pad 80. As can be seen in FIG. 4, a partial plating of the pad is accomplished using one composition of solder 55. A second opening 72 is then photolithographically-defined over a second C4 pad 81, as illustrated in FIG. 5. The combined width of the second opening 72 and C4 pad diameter 81 determines the diameter of the second C4 interconnection. As seen in FIG. 6, both pads then have an additional solder of a second composition 75 plated on. After the plating mask 90 is stripped and the solder 55 and 75 reflowed, the structure left is that of two different size (height and diameter) and different composition C4 interconnections 70 and 50 as seen in FIG. 7. The two varied C4 structures on chip 30 may then be used to join chip 30 to chip 40 and substrate/package 20 to produce the structure of FIG. 1. Although the process shown is done on the same chip 30, different C4 interconnections may be fabricated on separate chips or other joining planes and then applied together to achieve a similar structure such as the one shown in FIG. 1.

Figure 8:
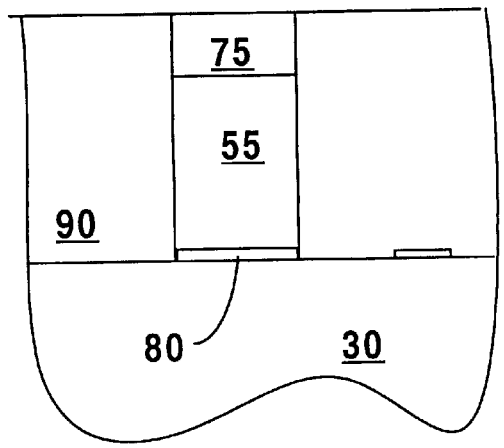
FIGS. 8, 9 and 10 are cross-sectional views showing a fabrication sequence of the chip-on-chip interconnections of FIG. 1 in accordance with a second embodiment of the present invention.
Figure 9:
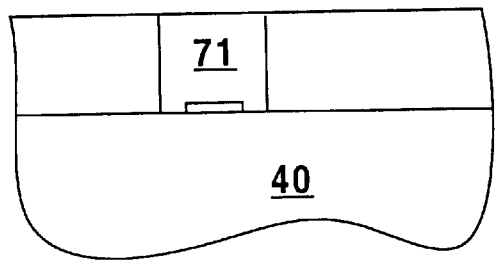
Figure 10:
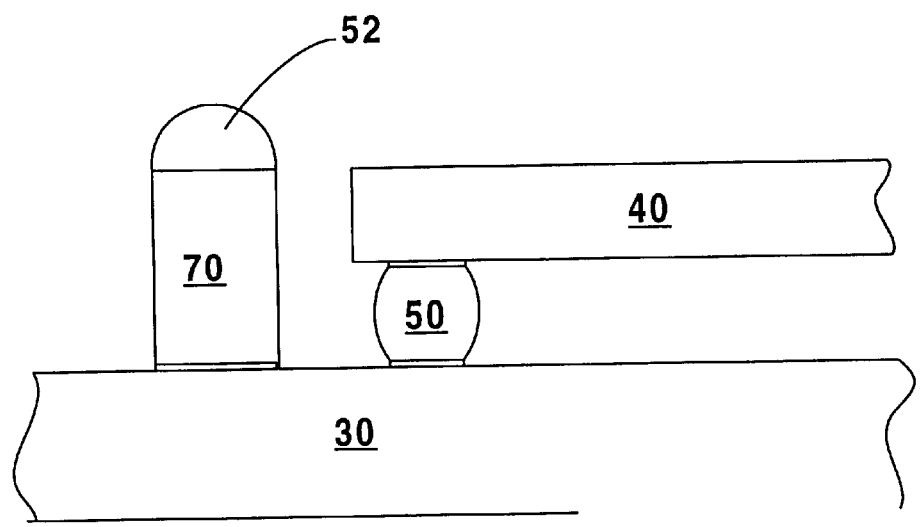

As aforementioned, the structure in FIG. 1 may be fabricated alternatively by forming the different size C4 connections on separate chips and then joining them together, as shown in FIGS. 8–10. This process eliminates the need for a two step masking sequence described in FIGS. 3–7. FIG. 8 illustrates the method of forming a large solder ball or column over a C4 pad through a masked opening on chip 30. In this example, a column is plated with a first composition 55 and a second composition 75, the first composition 55 having a higher reflow temperature than the second composition 75. The mask covers a smaller C4 pad to be used for the C4 connection pad to chip 40 (FIG. 9). FIG. 9 shows the formation of a smaller conventional C4 ball on chip 40 also using a mask. This C4 connection is plated with a third composition 71, which has a lower reflow temperature than the first composition 55, but a higher reflow temperature than the second composition 75. As seen in FIG. 10, chip 30 is then joined to chip 40 with the small C4 connections 50 on chip 40 connecting to the C4 pad on chip 30. The joined assembly can then be joined using the larger C4 connections or column on chip 30 to a carrier, substrate, or third chip, through intermediate composition 52, as shown in FIG. 1.

Figure 11:
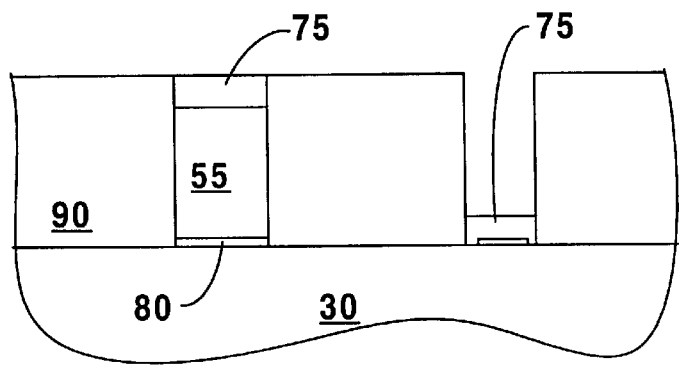
FIGS. 11, 12 and 13 are cross-sectional views showing a fabrication sequence of the chip-on-chip interconnections of FIG. 1 in accordance with a third and fourth embodiment of the present invention.
Figures 12, 13:
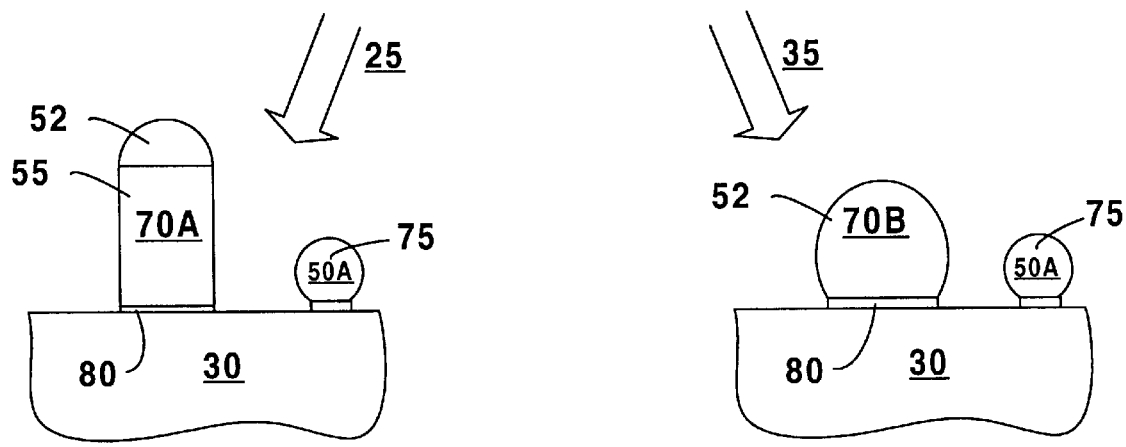

FIGS. 11–13 illustrate how a solder column or solder bump structure may be formed from the same set of plated C4 interconnections of differing compositions (FIG. 11) depending on the reflow temperature. FIG. 11 is fabricated similar to steps shown in FIGS. 3–6, producing a first plated C4 interconnection with a first composition 55 and a second composition 75, and a second plated C4 interconnection with only a second composition 75. As seen in FIG. 12, after the mask is stripped and through a low temperature reflow 25, a first C4 interconnection 70A is formed having a column of a first composition 55 and a top portion of an intermediate composition 52. The second C4 interconnection 50A is composed of the second composition 75. In FIG. 13, a high temperature reflow 35 produces a first C4 interconnection 70B of an intermediate composition 52, the intermediate composition 52 being of a composition level between the first composition 55 and the second composition 75. Again, the second C4 interconnection 50A is composed of the second composition 75.

Figure 14:
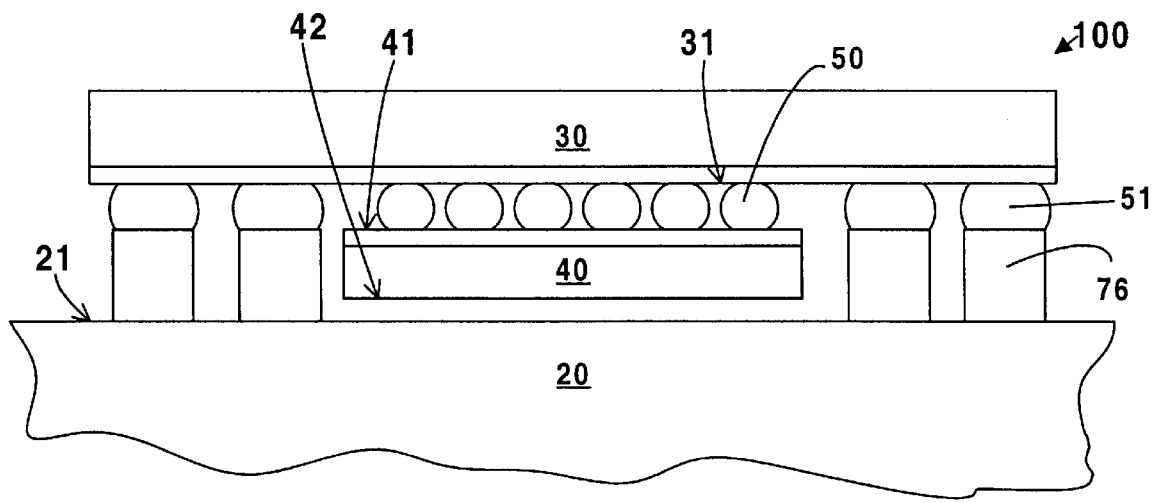
FIGS. 14 and 15 are exemplary cross-sectional views of semiconductor packages using the chip-on-chip interconnections in accordance with an embodiment of the present invention.
Figure 15:
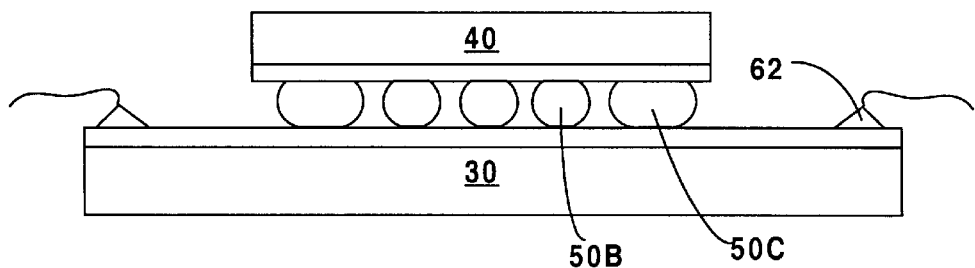

FIGS. 14 and 15 illustrate exemplary chip structures utilizing the varied C4 interconnections of the present invention. As seen in FIG. 14, a package 100 comprises a chip1/chip2 structure and substrate 20. Chip 30 is joined to chip 40 through C4 interconnections 50. C4 interconnections 50 may be of a high or low reflow temperature solder. Chip 30 is joined to the substrate 20 through a column 76, which may already be built upon the substrate, or may be a low reflow temperature solder, and joined to the chip 30 through a low or high reflow temperature solder 51. The column and other C4 interconnections may be made of solders such as lead free solders or low alpha solders, or metallic material such as copper.

FIG. 15 illustrate a chip1/chip2 structure wherein the signal outputs are joined through signal C4 interconnections 50B and the power outputs are joined through power C4 interconnections 50C. In this example, the diameters of the power C4 interconnections 50C are larger than the diameters of the signal C4 interconnections 50B, facilitating the power outputs. Other interconnections such as wirebond 62 may also be used in the structure, if desired.

Thus, the chip-on-chip interconnections according to the present invention allows for connections between devices and substrates at different levels and/or compositions.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method for joining chip-on-chip assemblies of different diameters, heights and levels comprising the steps of:
    a) fabricating a first interconnection having a first characteristic to connect a first chip and a substrate;
    b) fabricating a second interconnection having a second characteristic to connect said first chip and a second chip on a joining plane of said first interconnection; and
    c) joining said first chip to said substrate, and said second chip between said first chip and said substrate by reflowing said first and second interconnections.

2. The method of claim 1, wherein said first and second interconnections of step a) and step b) are fabricated on said first chip and joined to said second chip.

3. The method of claim 1, wherein said first and second interconnections of step a) and step b) are fabricated on separate chips, which are joined together.

4. The method of claim 1, wherein said characteristic is a height of each interconnection.

5. The method of claim 4, wherein steps a) and b) further comprise the steps of:

1) placing a plating mask over a chip;
2) defining a first opening over a first pad of said chip for said first interconnection;
3) plating a material into said first opening;
4) defining a second opening over a second pad of said chip for said second interconnection;
5) plating said material into said first and said second opening; and
6) stripping said plating mask.

6. The method of claim 1, wherein said first characteristic is a first diameter and said second characteristic is a second diameter.

7. The method of claim 6, wherein steps a) and b) further comprise the steps of:
1) placing a plating mask over a chip;
2) defining a first opening over a first pad of said chip for said first interconnection;
3) defining a second opening over a second pad of said chip for said second interconnection, wherein said second opening has a smaller width than said first opening;
4) plating said material into said first and said second opening; and
5) stripping said plating mask.

8. The method of claim 7, wherein steps a) and b) further comprise the steps of:
1) placing a plating mask over a chip;
2) defining a first opening over a first pad of said chip for said first interconnection;
3) plating a first material of a first composition into said first opening;
4) defining a second opening over a second pad of said chip for said second interconnection;
5) plating a second material of a second composition into said first and said second opening; and
6) stripping said plating mask.

9. The method of claim 1, wherein said characteristic is a composition of each interconnection.

10. The method of claim 1 wherein reflowing further comprises:
reflowing said first and second interconnections at a first reflow temperature, wherein said first interconnection consists of a solder column of a first and third composition and said second chip-on-chip interconnection consists of a solder bump of a second composition.

11. The method of claim 1 wherein reflowing further comprises:
reflowing said first and second interconnections at a second reflow temperature, wherein said first interconnection consists of a solder bump of a third composition and said second interconnection consists of a solder bump of a second composition.

12. The method of claim 1, wherein said first and second interconnections of step a) and step b) are fabricated on said second chip and joined to said first chip.

13. A method of forming a chip-on-chip assembly, comprising:
forming a first solder bump interconnection, having a first height, between a first chip and a second chip; and
forming a second solder bump interconnection, having a second height, wherein the second height is different from the first height, between said first chip and a substrate on a joining plane of said first solder bump interconnection.

14. A method of forming a chip-on-chip interconnections having different characteristics, comprising:
placing a mask over a chip;
defining a first opening over a first pad of said chip;
plating a first material into said first opening;
defining a second opening over a second pad of said chip;
plating a second material into said first and second opening to form a first and a second interconnection;
stripping said plating mask; and
reflowing said first and second interconnections.

15. The method of claim 14, wherein said first interconnection has a first characteristic and said second interconnection has a second characteristic.

16. The method of claim 15, wherein said first characteristic is a first height and said second characteristic is a second height, and wherein said first height is greater than said second height.

17. The method of claim 15, wherein said first opening has a greater width than said second opening.

18. The method of claim 17, wherein said first characteristic is a first diameter and said second characteristic is a second diameter, and wherein said first diameter is greater than said second diameter.

19. The method of claim 15, wherein said first material is different from said second material.

20. The method of claim 19, wherein said first characteristic is a first composition and said second characteristic is a second composition.

21. The method of claim 14, wherein said first material has a composition substantially similar to said second material.

* * * * *